(12) United States Patent
Masuda et al.

(10) Patent No.: US 11,384,257 B2
(45) Date of Patent: Jul. 12, 2022

(54) CHEMICAL-MECHANICAL POLISHING COMPOSITION, RINSE COMPOSITION, CHEMICAL-MECHANICAL POLISHING METHOD, AND RINSING METHOD

(71) Applicant: CMC Materials KK, Tsu-shi (JP)

(72) Inventors: Tsuyoshi Masuda, Tsu-shi (JP);
Hiroshi Kitamura, Tsu-shi (JP);
Yoshiyuki Matsumura, Kashihara (JP);
Akihisa Namiki, Tsu-shi (JP)

(73) Assignee: CMC Materials KK

( * ) Notice: Subject to any disclaimer, the term of this patent is extended or adjusted under 35 U.S.C. 154(b) by 0 days.

(21) Appl. No.: 17/260,106

(22) PCT Filed: Jul. 12, 2019

(86) PCT No.: PCT/JP2019/027798
§ 371 (c)(1),
(2) Date: Jan. 13, 2021

(87) PCT Pub. No.: WO2020/013332
PCT Pub. Date: Jan. 16, 2020

(65) Prior Publication Data
US 2021/0284868 A1    Sep. 16, 2021

(30) Foreign Application Priority Data
Jul. 13, 2018 (JP) .............................. JP2018-133454

(51) Int. Cl.
*C09G 1/02* (2006.01)
*C11D 1/72* (2006.01)
*H01L 21/306* (2006.01)

(52) U.S. Cl.
CPC ............... *C09G 1/02* (2013.01); *C11D 1/72* (2013.01); *H01L 21/30625* (2013.01)

(58) Field of Classification Search
None
See application file for complete search history.

(56) References Cited

U.S. PATENT DOCUMENTS

2003/0144163 A1    7/2003    Morinaga et al.
2004/0116315 A1    6/2004    Aoki et al.
(Continued)

FOREIGN PATENT DOCUMENTS

JP    2005105068 A    4/2005
JP    2007318072 A    12/2007
(Continued)

OTHER PUBLICATIONS

Japanese Patent Office /IPEA, International Preliminary Report on Patentability, issued in connection with Application No. PCT/JP2019/027798 dated Nov. 2, 2020.
(Continued)

*Primary Examiner* — Roberts P Culbert
(74) *Attorney, Agent, or Firm* — Thomas Omholt; Erika R. Singleton

(57) ABSTRACT

Provided is a chemical-mechanical polishing composition including an abrasive, a basic component, a polyoxyalkylene alkyl ether represented by the formula (i) RO-$(AO)_n$—H, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30, and an aqueous carrier, a rinse composition including the polyoxyalkylene alkyl ether and an aqueous carrier, and a substrate chemical-mechanical polishing method and a rinsing method in which these are used.

15 Claims, 2 Drawing Sheets

POLISHING COMPOSITION

(56) References Cited

U.S. PATENT DOCUMENTS

| 2007/0010411 A1 | 1/2007 | Amemiya et al. |
| 2009/0179172 A1* | 7/2009 | Hirano ............... C09G 1/02 |
| | | 252/79.1 |
| 2013/0183826 A1 | 7/2013 | Tsuchiya et al. |
| 2017/0243752 A1 | 8/2017 | Yasui |

FOREIGN PATENT DOCUMENTS

| JP | 2013053182 A | 3/2013 |
| JP | 2016194004 A | 11/2016 |

OTHER PUBLICATIONS

Japanese Patent Office/ISA, International Search Report and Written Opinion of the International Searching Authority issued in connection with Application No. PCT/JP2019/027798 dated Aug. 27, 2019.

* cited by examiner ical-mechanical polishing composition and a rinse composition, as well as a method of chemically-mechanically polishing a substrate and a method of rinsing a substrate in which these compositions are used.

CHEMICAL-MECHANICAL POLISHING COMPOSITION, RINSE COMPOSITION, CHEMICAL-MECHANICAL POLISHING METHOD, AND RINSING METHOD

FIELD

The present invention relates to a chemical-mechanical polishing composition and a rinse composition, as well as a method of chemically-mechanically polishing a substrate and a method of rinsing a substrate in which these compositions are used.

BACKGROUND

The silicon wafers used in the production of semiconductor devices have strict surface quality requirements. In order to ensure such surface quality, conventionally, a chemical-mechanical polishing (CMP) technology has been used. In the CMP of silicon wafers, along with a recent increase in demand and the advancement of high performance and high integration of semiconductor devices, in addition to an improvement in productivity, an improvement in surface quality has been increasingly demanded. In particular, in order to realize high integration and high speed, such as in ultra-large-scale integrated circuits (ULSI) used for computers, refinement of design rules of semiconductor devices is progressing year by year. Additionally, the importance of managing nano-level surface defects, which has not been a problem in the past, is increasing.

Surface defect inspection devices are generally used to manage surface defects on silicon wafers. The defects detected by a surface defect inspection device include foreign matter and residue on a silicon wafer which could not be removed by a polishing process or rinsing process. As such a surface defect inspection device, devices which irradiate a surface of the silicon wafer with light, such as laser light, and then detect reflected light or scattered light generated at the surface of the silicon wafer to detect defects on the surface of the silicon wafer are generally known.

When the surface of a silicon wafer is irradiated with such strong light, clouding may be seen due to diffuse reflection as a result of the roughness of the silicon wafer surface. This clouding is referred to as haze, and since haze has a close relationship with the surface roughness of the silicon wafer, haze can be used as an indicator of surface roughness. In recent years, though surface defects can be observed on a nano-level due to the rapid progress of surface defect inspection devices, when haze is present on the silicon wafer surface, the diffusely reflected light caused by the haze becomes background noise, whereby defect detection by the surface defect inspection device may be hindered. Thus, as the size of surface defects to be managed decreases, the need to achieve lower surface roughness and reduce haze levels is increasing.

Patent Literature 1 describes a polishing slurry comprising a chain hydrocarbon polymer having a carbon long-chain structure and a hydroxy lower alkoxy group as a side chain in a polishing slurry comprising an alkali component and colloidal silica. Patent Literature 1 further describes that since the above polishing slurry is excellent in the improvement of swelling and haze and polishing speed can be maintained at practical levels, the polishing slurry is extremely useful particularly as a polishing slurry for secondary polishing.

Patent Literature 2 describes a polishing composition comprising (A) a block-type polyether represented by the general formula HO-$(EO)_a$—$(PO)_b$-$(EO)_c$—H (where EO represents an oxyethylene group, PO represents an oxypropylene group, and a, b, and c are integers of 1 or more), (B) silicon dioxide, (C) a basic compound, (D) at least one selected from hydroxyethyl cellulose and polyvinyl alcohol, and (E) water. Patent Literature 2 further describes that according to such a polishing composition, silicon wafer polishing speed can be increased, and haze level and COP can be improved.

Patent Literature 3 describes a polishing composition comprising a nonionic surfactant having a molecular weight from 1,000 to less than 100,000 and an HLB value of 17 or more, a basic compound, and water. Patent Literature 3 further describes that according to the above polishing composition, in addition to enabling a reduction of semiconductor substrate surface haze after polishing, the adhesion of particles to the surface can be suppressed.

Patent Literature 4 describes a silicon wafer polishing composition comprising water, a basic compound, and a nonionic surfactant composed of a polyoxyethylene adduct, wherein the polyoxyethylene adduct has an HLB value of 8 to 15, the weight average molecular weight of the polyoxyethylene adduct is 1400 or less, the average addition mol numbers of oxyethylene of the polyoxyethylene adduct is 13 or less, and the content of the polyoxyethylene adduct in the polishing composition is 0.00001 to 0.10% by mass. Patent Literature 4 further describes that according to the above polishing composition, haze can be reduced by suppressing roughness of the silicon wafer surface caused by the polishing or rinsing of the silicon wafer, and as a result, evaluation of minute defects and product management based on thereon becomes easy.

CITATION LIST

Patent Literature

[PTL 1] Japanese Unexamined Patent Publication (Kokai) No. 11-140427
[PTL 2] Japanese Unexamined Patent Publication (Kokai) No. 2005-85858
[PTL 3] Japanese Unexamined Patent Publication (Kokai) No. 2011-181765
[PTL 4] WO 2012/039390

SUMMARY

Technical Problem

In general, when carrying out a chemical-mechanical polishing operation, slurry used in the polishing, the abrasive included in the slurry, and the shavings produced by polishing adhere to or are deposited on the polishing pad. If this foreign matter and/or residue is allowed to remain on the polishing pad as-is, when a subsequent chemical-mechanical polishing operation is performed, there is a risk that they will generate defects on the substrate surface of the silicon wafer or the like. Thus, in general, prior to each polishing step, this foreign matter and/or residue is removed from the polishing pad by carrying out pad conditioning or the like.

However, for example, if the additive components contained in the polishing composition for reducing haze and/or for other purposes can easily adhere to the polishing pad, and if such components are adhered to the polishing pad during polishing, such adhered additive components may not be completely removed by the above pad conditioning in some cases. In such a case, as the polishing of substrates such as silicon wafers is repeatedly performed, such additive components gradually accumulate on the polishing pad. There is not only a risk of such accumulated additive components themselves causing defects on the substrate surface during polishing, but additionally there is a risk that the wettability of the substrate surface will be reduced. If the wettability of the substrate surface is reduced, shavings generated by the polishing and other foreign matter easily adhere to the substrate, and as a result, there is a risk that defects will be generated on the substrate surface. Thus, not only is it extremely important that the additive components included in a polishing composition used during the polishing process and a rinse composition used in a rinse process after the polishing process, be capable of reducing the haze of the substrate surface, but it is also extremely important that they not adversely impact the wettability of the substrate surface.

In PTLs 1 to 4, though additive components which can reduce the haze of a substrate surface are described, the effects of these additive components on the wettability of the substrate surface have not been sufficiently examined.

The present invention aims to provide a chemical-mechanical polishing composition and rinse composition which can reduce the haze of a substrate surface and which can maintain the wettability of the substrate surface, and a method of chemical-mechanical polishing a substrate and a method of rinsing a substrate using these compositions.

Solution to Problem

The present invention, which can achieve the aforementioned objects, is as described below.

(1) A chemical-mechanical polishing composition, comprising:
an abrasive,
a basic component,
a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, n represents average addition mol numbers of AO and is 2 to 30, and an aqueous carrier.

(2) The chemical-mechanical polishing composition of (1), wherein R is a linear or branched $C_1$ to $C_{13}$ alkyl group.

(3) The chemical-mechanical polishing composition of (1), wherein R is a branched $C_{11}$ to $C_{15}$ alkyl group.

(4) The chemical-mechanical polishing composition of (1), wherein the polyoxyalkylene alkyl ether comprises at least one of polyoxyethylene oxypropylene 2-propylheptyl ether, and polyoxyethylene isotridecyl ether.

(5) The chemical-mechanical polishing composition of any one of (1) to (4), further comprising a water-soluble polymer different from the polyoxyalkylene alkyl ether.

(6) The chemical-mechanical polishing composition of (5), wherein the water-soluble polymer comprises at least one selected from the group consisting of a cellulose derivative, a polymer containing a polyvinyl alcohol structural unit, an alkylene polyalkylene oxide amine polymer containing at least two repeating structural units containing a tertiary amine having an alkylene group and a polyalkyleneoxide group bound to an N atom, and any combination thereof.

(7) The chemical-mechanical polishing composition of (6), wherein the water-soluble polymer comprises a cellulose derivative, a polymer containing a polyvinyl alcohol structural unit, and an alkylene polyalkylene oxide amine polymer containing at least two repeating structural units containing a tertiary amine having an alkylene group and a polyalkyleneoxide group bound to an N atom.

(8) The chemical-mechanical polishing composition of (6), wherein the water-soluble polymer is a polymer containing a polyvinyl alcohol structural unit.

(9) A rinse composition, comprising:
a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, n represents average addition mol numbers of AO and is 2 to 30, and
an aqueous carrier.

(10) The rinse composition of (9), wherein R is a linear or branched $C_1$ to $C_{13}$ alkyl group.

(11) The rinse composition of (9), wherein R is a branched $C_{11}$ to $C_{15}$ alkyl group.

(12) The rinse composition of (9), wherein the polyoxyalkylene alkyl ether comprises at least one of polyoxyethylene oxypropylene 2-propylheptyl ether, and polyoxyethylene isotridecyl ether.

(13) The rinse composition of any one of (9) to (12), further comprising a water-soluble polymer different from the polyoxyalkylene alkyl ether.

(14) The rinse composition of (13), wherein the water-soluble polymer comprises at least one selected from the group consisting of a cellulose derivative, a polymer containing a polyvinyl alcohol structural unit, an alkylene polyalkylene oxide amine polymer containing at least two repeating structural units containing a tertiary amine having an alkylene group and a polyalkyleneoxide group bound to an N atom, and any combination thereof.

(15) The rinse composition of (14), wherein the water-soluble polymer comprises a cellulose derivative, a polymer containing a polyvinyl alcohol structural unit, and an alkylene polyalkylene oxide amine polymer containing at least two repeating structural units containing a tertiary amine having an alkylene group and a polyalkyleneoxide group bound to an N atom.

(16) The rinse composition of (14), wherein the water-soluble polymer is a polymer containing a polyvinyl alcohol structural unit.

(17) A method of chemically-mechanically polishing a substrate, comprising:
contacting a substrate with a polishing pad and a chemical-mechanical polishing composition of any one of (1) to (8),
moving the polishing pad relative to the substrate with the chemical-mechanical polishing composition therebetween, and
abrading at least a portion of the substrate to polish the substrate.

(18) A method of rinsing a substrate, comprising:
contacting a substrate after chemically-mechanically polishing with a polishing pad and a rinse composition of any one of (9) to (16), and
moving the polishing pad relative to the substrate with the rinse composition therebetween.

Advantageous Effects of Invention

According to the present invention, by using a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30, substrate surface haze can be reduced as compared to the case in which the polyoxyalkylene alkyl ether is not used, and further, even when a substrate polishing operation is performed for a long period of time using the chemical-mechanical polishing composition comprising the polyoxyalkylene alkyl ether, substrate surface wettability can be maintained at a high level which is equivalent to the case in which a chemical-mechanical polishing composition which does not comprise the polyoxyalkylene alkyl ether is used. Thus, according to the chemical-mechanical polishing composition of the present invention, which comprises such a polyoxyalkylene alkyl ether, by reducing the haze of the substrate surface, it is possible to reduce the background noise during defect detection by a surface defect inspection system, whereby detection and management of micro surface defects, for example, nano-level surface defects, can be facilitated using the surface defect inspection device. Additionally, according to the chemical-mechanical polishing composition of the present invention, the occurrence of surface defects caused by the reduction in the wettability of the substrate surface can be reliably eliminated, and the life of the polishing pad can be improved.

DESCRIPTION OF EMBODIMENTS

<Chemical-Mechanical Polishing Composition>

Figure 1:
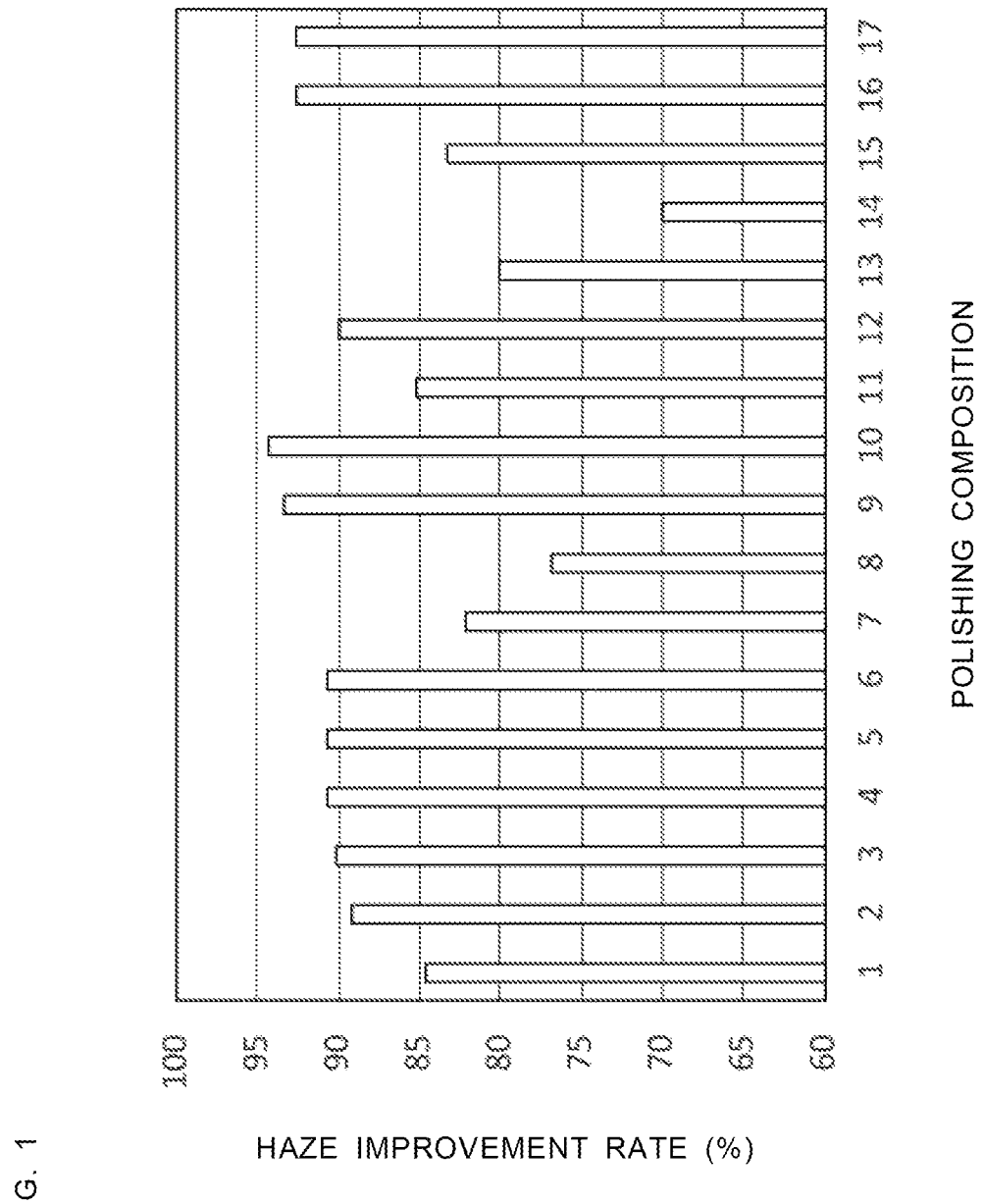
FIG. 1 shows the silicon wafer surface haze improvement rate (%) after polishing silicon wafers using polishing compositions 1 to 17.

The chemical-mechanical polishing composition of the present invention comprises:
an abrasive,
a basic component,
a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30, and
an aqueous carrier.

In general, the polishing pads used in the chemical-mechanical polishing of substrates, such as silicon wafers are repeatedly used in a plurality of substrate chemical-mechanical polishing operations with carrying out pad conditioning or the like between each polishing step. However, as described above, for example, additive components contained in the polishing composition for reducing haze and/or for other purposes adhere to the polishing pad during polishing, and such additive components cannot be completely removed by such pad conditioning in some cases. In such a case, as the polishing of substrates is repeatedly performed, such additive components gradually accumulate on the polishing pad, and there is a risk that the wettability of the substrate surface will be reduced. A reduction in the wettability of the substrate surface leads to the adhesion of shavings and other foreign matter to the substrate, whereby there is a risk that defects will be generated on the substrate surface. Thus, not only is it extremely important that the additive components included in a polishing composition used during the polishing process and a rinse composition used in a rinse process after the polishing process, be capable of reducing the haze of the substrate surface, it is also extremely important that they not adversely impact the wettability of the substrate surface.

The present inventors have examined additive components in the chemical-mechanical polishing composition which do not adversely impact the wettability of the substrate surface while reducing haze of the substrate surface. As a result, the present inventors have discovered that by using a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30, as an additive component, substrate surface haze has can be reduced as compared to the case in which the polyoxyalkylene alkyl ether is not used, and further, even when a substrate polishing operation is performed for a long period of time using a chemical-mechanical polishing composition comprising the polyoxyalkylene alkyl ether, substrate surface wettability can be maintained at a high level which is equivalent to the case in which a chemical-mechanical polishing composition which does not comprise the polyoxyalkylene alkyl ether is used.

Thus, according to the chemical-mechanical polishing composition of the present invention, which comprises such a polyoxyalkylene alkyl ether, by reducing the haze of the substrate surface, it is possible to reduce the background noise during defect detection by a surface defect inspection device, whereby detection and management of micro surface defects, for example, nano-level surface defects, using the surface defect inspection device can be facilitated. Additionally, according to the chemical-mechanical polishing composition of the present invention, reduction in the wettability of the substrate surface due to the accumulation of additive components such as the above polyoxyalkylene alkyl ether in the polishing pad can be substantially or completely prevented, whereby the occurrence of surface defects caused by the reduction in the wettability of the substrate surface can be reliably eliminated, and the life of the polishing pad can be improved. Furthermore, according to the present invention, not only when the above polyoxyalkylene alkyl ether is used in chemical-mechanical polishing compositions, but when used in a rinse composition, the same effects can be achieved.

[Abrasive]

The abrasive of the present invention may be any suitable abrasive which is known to a person skilled in the art in the chemical-mechanical polishing of semiconductor substrates such as silicon wafers. The abrasive may be, for example, an abrasive selected from the group consisting of alumina (e.g., α-alumina, γ-alumina, δ-alumina, and fumed alumina), silica (e.g., colloidal silica, precipitated silica, and fumed silica), ceria, titania, zirconia, germania, magnesia, co-formed products thereof, and any combinations thereof, though the abrasive is not limited thereto. The abrasive is preferably selected from the group consisting of alumina, silica, ceria, zirconia, and combinations thereof, more preferably silica, in particular colloidal silica or ceria, and particularly preferably colloidal silica.

In the present invention, the abrasive can have any suitable particle size. For example, the abrasive can have an average primary particle size of 0.01 μm or more, 0.015 μm or more, 0.02 µm or more, or 0.025 µm or more, and 3 µm or less, 1.5 µm or less, 0.8 µm or less, 0.5 µm or less, or 0.1 µm or less, though the particle size of the abrasive is not limited thereto. From the viewpoint of improving the substrate polishing speed, the abrasive preferably has an average primary particle size in the range of 0.01 to 1.5 µm, more preferably 0.01 to 0.5 µm, and especially preferably 0.01 to 0.1 µm. Further, when the primary particles aggregate to form secondary particles, from the viewpoint of increasing polishing speed and reducing surface roughness of a substrate to be polished, the abrasive preferably has an average secondary particles size in the range of 0.02 to 3 µm, more preferably 0.02 to 1.0 µm, and especially preferably 0.02 to 0.2 µm. The average primary particle size of the abrasive can be determined by performing image analysis on an image captured with a scanning electron microscope (SEM) or transmission electron microscope (TEM). Furthermore, the average secondary particle size can be measured as a volume average particle size using a laser light scattering method.

The abrasive may be present in the chemical-mechanical polishing composition in a quantity of, for example, 0.01% by mass or more, 0.02% by mass or more, 0.05% by mass or more, or 0.10% by mass or more, and 20% by mass or less, 15% by mass or less, 12% by mass or less, or 10% by mass or less based on the mass of the aqueous carrier and all of the components dissolved or suspended therein. The abrasive may be preferably present in the chemical-mechanical polishing composition in a quantity in the range of 0.01 to 20% by mass, more preferably 0.05 to 15% by mass, and especially preferably 0.1 to 10% by mass.

[Basic Component]

The basic component of the present invention may be an any component which can act chemically on the surface of a semiconductor substrate such as a silicon wafer to assist mechanical polishing with the abrasive. Though not particularly limited, the basic component may be a compound selected from the group consisting of, for example, ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, sodium carbonate, methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, tetraethylenepentamine, anhydrous piperazine, piperazine hexahydrate, 1-(2-aminoethyl)piperazine, N-methyl piperazine, and any combinations thereof. The basic compound is preferably selected from the group consisting of ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate. More preferably the basic component is ammonia, potassium hydroxide, sodium hydroxide, tetramethylammonium hydroxide, or tetraethylammonium hydroxide, and especially preferably ammonia.

The basic component may be present in the chemical-mechanical polishing composition in a quantity of, for example, 0.001% by mass or more, 0.002% by mass or more, 0.005% by mass or more, or 0.01% by mass or more, and 2.0% by mass or less, 1.5% by mass or less, 1.2% by mass or less, or 1.0% by mass or less based on the mass of the aqueous carrier and all of the components which are dissolved or suspended therein. The basic component may be preferably present in the chemical-mechanical polishing composition in a quantity in the range of 0.001 to 2.0% by mass, more preferably 0.005 to 1.5% by mass, and especially preferably 0.01 to 1.0% by mass.

[Polyoxyalkylene Alkyl Ether]

The chemical-mechanical polishing composition of the present invention comprises a polyoxyalkylene alkyl ether represented by the formula (i) RO-(AO)$_n$—H, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30. By including such a polyoxyalkylene alkyl ether as an additive component, substrate surface haze can be reduce as compared to the case in which the polyoxyalkylene alkyl ether is not included, and further, a reduction in the wettability of the substrate surface due to the accumulation of additive components such as the polyoxyalkylene alkyl ether in the polishing pad can be substantially or completely prevented. Thus, according to the chemical-mechanical polishing composition of the present invention, which comprises the polyoxyalkylene alkyl ether, the occurrence of surface defects caused by the reduction in the wettability of the substrate surface can be reliably eliminated, and the life of the polishing pad can be improved.

Even if the carbon number of the R group of formula (i) is 16 or more, regarding specific polyoxyalkylene alkyl ethers, substrate surface haze can be reduced. However, if the carbon number of the R group of formula (i) is 16 or more, since such polyoxyalkylene alky ether, for example, polyoxyethylene cetyl ether or polyoxyethylene stearyl ether, easily accumulates in the polishing pad, the polyoxyalkylene alkyl ether cannot be completely removed by pad conditioning or the like, which is carried out prior to each polishing step. Thus, as the polishing of substrates is repeatedly performed, polyoxyalkylene alkyl ether gradually accumulates on the polishing pad. The accumulated polyoxyalkylene alkyl ether reduces the wettability of the substrate surface, which itself may, in some cases, cause defects on the substrate surface during polishing. Furthermore, if the wettability of the substrate surface is reduced, polishing debris and other foreign matter are likely to adhere to the substrate, and as a result, may cause defects on the substrate surface.

Thus, in the present invention, it is necessary that the R in formula (i) be a linear or branched $C_1$ to $C_{15}$ alkyl group. In order to reduce substrate surface haze and to more reliably prevent a reduction in the wettability of the substrate surface due to the accumulation of polyoxyalkylene alkyl ether in the polishing pad, the R is preferably a linear or branched $C_1$ to $C_{13}$ alkyl group. Furthermore, in another preferable aspect of the present invention, R may be a branched $C_{11}$ to $C_{15}$ alkyl group, a branched $C_{12}$ to $C_{14}$ alkyl group, or a branched $C_{13}$ alkyl group (e.g., an isotridecyl group).

The A in formula (i) may be an ethylene group or a propylene group, and may be an any combination of one or a plurality of ethylene groups and one or a plurality of propylene groups. In a specific preferable aspect of the present invention, A is an ethylene group or a combination of an ethylene group and a propylene group.

The n in formula (i) represents the average addition mol numbers of AO, and may be appropriately determined within the range of 2 to 30. From the viewpoint of improving the reduction of substrate surface wettability due to the accumulation of polyoxyalkylene alkyl ether in the polishing pad, n is preferably a larger value, and may be, for example, 5 or more, 6 or more, 8 or more, 10 or more, 11 or more, or 12 or more. Furthermore, n may be 28 or less, and may be, for example, 25 or less, or 23 or less. Note that in the present invention, the "average addition mol numbers of AO" is referred to as the average value of the mol number of oxyalkylene units contained in one mol of polyoxyalkylene alkyl ether.

Though not particularly limited, specific examples of the above polyoxyalkylene alkyl ether include polyoxyethylene isopropyl ether, polyoxyethylene isobutyl ether, polyoxyethylene sec-butyl ether, polyoxyethylene t-butyl ether, polyoxyethylene isopentyl ether, polyoxyethylene isohexyl ether, polyoxyethylene heptyl ether, polyoxyethylene isoheptyl ether, polyoxyethylene isooctyl ether, polyoxyethylene isononyl ether, polyoxyethylene isodecyl ether, polyoxyethylene oxypropylene 2-propyl heptyl ether, polyoxyethylene undecyl ether, polyoxyethylene isoundecyl ether, polyoxyethylene lauryl ether, polyoxyethylene isolauryl ether, polyoxyethylene tridecyl ether, polyoxyethylene isotridecyl ether, polyoxyethylene tetradecyl ether, polyoxyethylene isotetradecyl ether, polyoxyethylene pentadecyl ether, and polyoxyethylene isopentadecyl ether.

The above polyoxyalkylene alkyl ether preferably includes at least one of polyoxyethylene isodecyl ether, polyoxyethylene oxypropylene 2-propyl heptyl ether, polyoxyethylene lauryl ether, and polyoxyethylene isotridecyl ether, and especially preferably includes at least one of polyoxyethylene oxypropylene 2-propyl heptyl ether, and polyoxyethylene isotridecyl ether. These polyoxyalkylene alkyl ethers may be synthesized by any method known to a person skilled in the art or may be commercially obtained.

(HLB Value)

In the present invention, the HLB value of the polyoxyalkylene alkyl ether is calculated according to the Griffin method, more specifically, is calculated by the following formula:

$$\text{HLB value} = 20 \times (\text{sum of formula weight of hydrophilic portion})/(\text{molecular weight})$$

The hydrophilic portion of polyoxyalkylene alkyl ether correspond to the polyoxyalkylene, i.e., the $(AO)_n$ portion of formula (i), and thus, it is obvious that the HLB value varies depending on the carbon number of the R group and the average addition mol numbers of the oxyalkylene (AO). However, regarding the effect of the present invention, in particular, an improvement of substrate surface wettability, the carbon number of the R group in formula (i) is the dominant parameter, and thus, the substrate surface wettability is not greatly influenced by the HLB value. Thus, the polyoxyalkylene alkyl ether according to the present invention can have any suitable HLB value. In general, the HLB value may be appropriately determined within the range of 12 to 18.

(Molecular Weight)

In the present invention, the polyoxyalkylene alkyl ether can have any suitable molecular weight. Though not particularly limited, the polyoxyalkylene alkyl ether can have an average molecular weight of about 100 to about 2,000.

The polyoxyalkylene alkyl ether may be present in the chemical-mechanical polishing composition in a quantity of, for example, 0.01 ppm or more, 0.02 ppm or more, 0.05 ppm or more, or 0.1 ppm or more, and 5000 ppm or less, 3000 ppm or less, 1000 ppm or less, or 500 ppm or less based on the mass of the aqueous carrier and all of the components which are dissolved or suspended therein. The polyoxyalkylene alkyl ether may be preferably present in the chemical-mechanical polishing composition in a quantity in the range of 0.1 to 5000 ppm (0.00001 to 0.5% by mass), more preferably 0.1 to 1000 ppm (0.00001 to 0.1% by mass), and especially preferably 0.1 to 500 ppm (0.00001 to 0.05% by mass).

[Aqueous Carrier]

The aqueous carrier is used to facilitate the application of all of the components which are dissolved or suspended in the aqueous carrier to a suitable substrate surface to be polished. The aqueous carrier may typically be composed of only water, may include water and a water-soluble solvent, or may be an emulsion. An alcohol such as, for example, methanol or ethanol, is preferably used as the water-soluble solvent. The aqueous carrier is preferably water, and more preferably deionized water.

The chemical-mechanical polishing composition of the present invention can have any suitable pH, and the specific pH value may be appropriately determined in consideration of polishing speed and the like. For example, the chemical-mechanical polishing composition can have a pH of 7 to 12, and preferably has a pH of 8 to 12, more preferably 8.5 to 12. The pH value can be adjusted by adding a pH adjusting agent as necessary. The pH adjusting agent may be an any alkaline substance, and may be the same as or different from the above basic component. The pH adjusting agent is preferably selected from the group consisting of ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate. The pH adjusting agent is more preferably ammonia, potassium hydroxide, sodium hydroxide, tetramethylammonium hydroxide, or tetraethylammonium hydroxide, and especially preferably ammonia.

[Water-Soluble Polymer]

The chemical-mechanical polishing composition of the present invention may optionally further include a water-soluble polymer which is different from the above polyoxyalkylene alkyl ether. Though not particularly limited, the water-soluble polymer can include at least one selected from the group consisting of cellulose derivatives, polymers including polyvinyl alcohol structural units, alkylene polyalkylene oxide amine polymers containing at least two repeating structural units containing a tertiary amine having an alkylene group and a polyalkylene oxide group bound to an N atom, and any combinations thereof.

From the viewpoint of haze reduction, by using, for example, the above alkylene polyalkylene oxide amine polymer along with the polyoxyalkylene alkyl ether according to the present invention, a higher haze reduction effect can be achieved as compared to the case in which either of them is used alone as an additive components. In general, since the effects of the additive components have a saturation region, even if the content thereof is increased, the corresponding effect cannot be sufficiently obtained in the region above a certain content. Thus, it is difficult to greatly improve the haze value by simply increasing the content of the polyoxyalkylene alkyl ether according to the present invention. Furthermore, when the content of the polyoxyalkylene alkyl ether is too high, the amount of accumulation on the polishing pad also increases, which is not preferable from the viewpoint of improving wettability.

However, according to a preferable aspect of the present invention, by adding the alkylene polyalkylene oxide amine polymer along with the polyoxyalkylene alkyl ether, a haze reduction effect which cannot be achieved by the polyoxyalkylene alkyl ether alone can be obtained. Thus, from the viewpoint of haze reduction, the chemical-mechanical polishing composition of the present invention preferably includes, as the water-soluble polymer different from the polyoxyalkylene alkyl ether, an alkylene polyalkylene oxide amine polymer containing at least two repeating structural units containing a tertiary amine having an alkylene group and a polyalkyleneoxide group bound to an N atom, and in a specific preferable aspect of the present invention, the water-soluble polymer further includes, in addition to the alkylene polyalkylene oxide amine polymer, a cellulose derivative and a polymer containing polyvinyl alcohol structural units. In particular, since the polymer containing polyvinyl alcohol structural units, can also act as a wetting agent, by using the polymer containing polyvinyl alcohol structural units, the effect of suppressing reduction of wettability by the addition of the polyoxyalkylene alkyl ether can be achieved.

Though not to be bound by any particular theory, it is believed that polyoxyalkylene alkyl ethers, in particular, polyoxyethylene alkyl ethers, have a high surface active performance, and thus, the concentration range in which a stable polishing performance is demonstrated is narrow, and the concentration dependent property thereof also tends to fluctuate depending on various polishing conditions such as abrasive flow rate, polishing pad size, and type of polishing pad (pad material, hole diameter, groove pattern). It is believed that by adding together alkylene polyalkylene oxide amine polymers, which have a relatively poor concentration dependent property and which can be added in large quantities, in particular alkylene polyalkylene oxide amine polymers which are EO-PO type surfactants containing both EO and PO groups, even under the above various polishing conditions, it is possible to alleviate the concentration dependent property of the polyoxyalkylene alkyl ether and maintain haze stability. The cellulose derivative, the polymer containing polyvinyl alcohol structural units, and the alkylene polyalkylene oxide amine polymer containing at least two repeating structural units containing a tertiary amine having an alkylene group and a polyalkyleneoxide group bound to a N atom will be described in detail below.

(Cellulose Derivative)

The optional cellulose derivative acts primarily as a wetting agent in the chemical-mechanical polishing composition of the present invention. Such a wetting agent is effective for maintaining the hydrophilicity of the surface of a substrate such as a silicon wafer. In the present invention, the cellulose derivative can be selected from, for example, methylcellulose, hydroxyethyl cellulose, hydroxypropyl cellulose, hydroxypropyl methylcellulose, and any combinations thereof, and the cellulose derivative is preferably hydroxyethyl cellulose. The cellulose derivative can have an average molecular weight of 50,000 to 2,000,000.

The cellulose derivative may be present in the chemical-mechanical polishing composition in a quantity of, for example, 0.001% by mass or more, 0.002% by mass or more, 0.005% by mass or more, or 0.01% by mass or more, and 2.0% by mass or less, 1.5% by mass or less, 1.2% by mass or less, or 1.0% by mass or less based on the mass of the aqueous carrier and all of the components which are dissolved or suspended therein. The cellulose derivative may be preferably present in the chemical-mechanical polishing composition in a quantity in the range of 0.001 to 2.0% by mass, more preferably 0.005 to 1.5% by mass, and especially preferably 0.01 to 1.0% by mass.

(Polymer Containing Polyvinyl Alcohol Structural Units)

In chemical-mechanical polishing, since it takes advantage of the mechanical interaction between the substrate and the polishing composition (slurry), continuous surface defects such as nanoscratches and PID may occur on the substrate during polishing due to the abrasive contained in the slurry and/or other particles aggregated in the slurry, etc. In the present invention, in order to reduce continuous surface defects on the substrate such as nanoscratches and PID, the chemical-mechanical polishing composition can include a polymer containing polyvinyl alcohol structural units.

The polymer containing polyvinyl alcohol structural units can also act as a wetting agent. Thus, in the chemical-mechanical polishing composition of the present invention, in order to maintain hydrophilicity of substrate surface, a polymer containing polyvinyl alcohol structural units may be used in place of or in addition to a cellulose derivative. Since cellulose derivatives are derived from natural cellulose, there is a problem that it is very difficult to maintain quality stability.

For example, when a polishing composition is actually used in chemical-mechanical polishing, it is common practice to filter the polishing composition prior to application onto the platen (surface plate) in order to remove agglomerated particles that can cause defects from the polishing composition. However, if a cellulose derivative is included in the polishing composition, the filtration member can become clogged during the filtration operation due to the cellulose derivative, and thus, frequent washing or replacement of the filtration member is required. Since the polymer containing polyvinyl alcohol structural units is a synthetic compound, quality control can be performed relatively easily as compared with a cellulose derivative. Thus, the use of a polymer containing polyvinyl alcohol structural units in place of a cellulose derivative can relatively easily solve the problems described above, which occur when a cellulose derivative is used. In this case, the water-soluble polymer which is different from the polyoxyalkylene alkyl ether according to the present invention may be composed only of a polymer containing polyvinyl alcohol structural units.

The polymer containing polyvinyl alcohol structural units may be an any polymer which contains polyvinyl alcohol structural units. For example, the polymer containing polyvinyl alcohol structural units may simply be polyvinyl alcohol, or may be a mixture containing a polyalkylene oxide such as polyethylene glycol, in addition to polyvinyl alcohol. Further, the polymer containing polyvinyl alcohol structural units may include, for example, polyvinyl alcohol structural units in the main chain or side chain of the polymer, and further, a part of the polyvinyl alcohol structural units may be substituted with an acyloxy group. Examples of the polymer containing polyvinyl alcohol structural units in the polymer main chain include polyvinyl alcohol-polyalkylene oxide graft copolymers containing polyvinyl alcohol structural units in the main chain thereof and polyalkylene oxide structural units in the side chain thereof, and the polyalkylene oxide structural units may include at least one selected from the group consisting of ethylene oxide, propylene oxide, and a combination thereof. In such a copolymer, the polyvinyl alcohol structural units and the polyalkylene oxide structural units may be present in the range of, for example, a molar ratio of 95:5 to 60:40, or 90:10 to 70:30.

Preferable examples of such a copolymer include polyvinyl alcohol-polyethylene oxide graft copolymers represented by the following formula (ii):

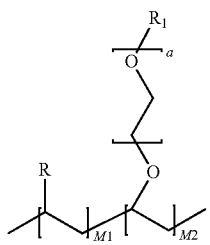

(ii)

where R is a hydroxyl group or an acyloxy group represented by R'COO— (where R' is a $C_1$ to $C_8$ alkyl group) (e.g., a $CH_3COO$— group), $R_1$ is a hydrogen atom, or an acyl group represented by R"CO— (where R" is a $C_1$ to $C_8$ alkyl group) (e.g., a $CH_3CO$— group), a is an integer from 1 to 10,000, M1 and M2 are respectively real numbers greater than 0 mol % and less than 100 mol %, and M1+M2=100 mol %. The copolymer of formula (ii) may have a structure in which R is a mix of a hydroxyl group and an acyloxy group, and more specifically, a structure in which a part of the acyloxy group is saponified to a hydroxyl group. The degree of saponification in this case is not particularly limited, and may be 70 to 100%, 80 to 100%, 90 to 100%, or 95 to 100%. The values of M1 and M2 can be appropriately determined in accordance with the abundance ratio of the polyvinyl alcohol structural units constituting the main chain and the polyethylene oxide structural units constituting the side chain.

More specific examples of the polyvinyl alcohol-polyethylene oxide graft copolymers of formula (ii) include polyvinyl alcohol-polyethylene oxide graft copolymers represented by the following formula (iii):

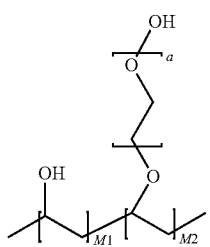

(iii)

where a is an integer from 1 to 10,000, M1 and M2 are respectively real numbers greater than 0 mol % and less than 100 mol %, and M1+M2=100 mol %. A part of the hydroxyl group of the polyvinyl alcohol structural units constituting the main chain of formula (iii) may be substituted with an acyloxy group represented by R'COO— (where R' is a $C_1$ to $C_8$ alkyl group), and likewise, a part of the terminal hydroxyl group of the polyethylene oxide structural units constituting the side chain of formula (iii) may be substituted with an acyl group represented by R"CO— (where R" is a $C_1$ to $C_8$ alkyl group).

Examples of polymers containing polyvinyl alcohol structural units in the polymer side chain include polyvinyl alcohol-polyalkylene oxide graft copolymers comprising polyalkylene oxide structural units in the main chains and polyvinyl alcohol structural units in the side chain, and the polyalkylene oxide structural units may include at least one selected from the group consisting of ethylene oxide, propylene oxide, and a combination thereof. In such a copolymer, the polyvinyl alcohol structural units and the polyalkylene oxide structural units may be present in the range of, for example, a molar ratio of 95:5 to 60:40 or 90:10 to 70:30.

Preferable examples of such a copolymer include polyvinyl alcohol-polyethylene oxide graft copolymers represented by, for example, the following formula (iv):

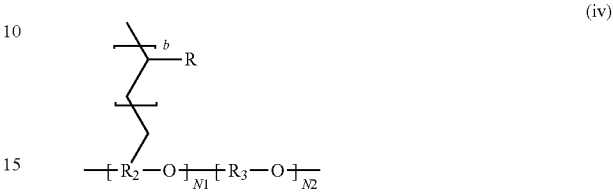

(iv)

where R is a hydroxyl group, or an acyloxy group represented by R'COO— (where R' is a $C_1$ to $C_8$ alkyl group) (e.g., a $CH_3COO$— group), $R_2$ and $R_3$ are each independently a linear or branched $C_2$ to $C_3$ alkylene group, b is an integer from 2 to 10,000, N1 and N2 are respectively a real number greater than 0 mol % and less than 100 mol %, and N1+N2=100 mol %. The copolymer of formula (iv) may have a structure in which R is a mix of a hydroxyl group and an acyloxy group, and more specifically, a structure in which a part of the acyloxy group is saponified to a hydroxyl group. The degree of saponification in this case is not particularly limited, and may be 70 to 100%, 80 to 100%, 90 to 100% or 95 to 100%. The values of N1 and N2 can be appropriately determined in accordance with the abundance ratio of the polyethylene oxide structural units constituting the main chain and the polyvinyl alcohol structural units constituting the side chain.

More specific examples of the polyvinyl alcohol-polyethylene oxide graft copolymer of formula (iv) include polyvinyl alcohol-polyethylene oxide graft copolymers represented by the following formula (v):

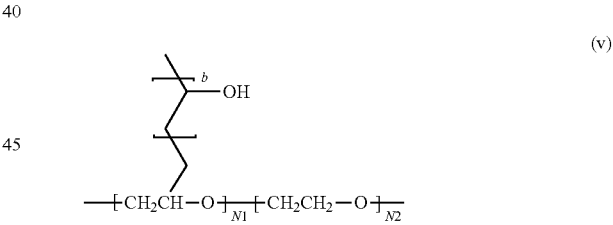

(v)

where b is an integer from 2 to 10,000, N1 and N2 are respectively real numbers greater than 0 mol % and less than 100 mol %, and N1+N2=100 mol %. A part of the hydroxyl group of the polyvinyl alcohol structural units constituting the side chain of formula (v) may be substituted with an acyloxy group represented by R'COO— (where R' is a $C_1$ to $C_8$ alkyl group).

When the polymer containing polyvinyl alcohol structural units is polyvinyl alcohol or a mixture of polyvinyl alcohol and polyalkylene oxide, the polyvinyl alcohol and polyalkylene oxide can have an average molecular weight of, for example, 1,000 to 10,000,000. Conversely, when the polymer containing polyvinyl alcohol structural units is the polyvinyl alcohol-polyethylene oxide graft copolymer described above, the polyvinyl alcohol-polyethylene oxide graft copolymer can have an average molecular weight of, for example, 5,000 to 500,000, 10,000 to 300,000, or 10,000 to 200,000.

The polymer containing polyvinyl alcohol structural units may be present in the chemical-mechanical polishing composition in a quantity of, for example, 0.1 ppm or more, 1 ppm or more, 2 ppm or more, or 5 ppm or more, and 5000 ppm or less, 3000 ppm or less, 1000 ppm or less, or 500 ppm or less based on the mass of the aqueous carrier and all of the components which are dissolved or suspended therein. The polymer containing polyvinyl alcohol structural units may be preferably present in the chemical-mechanical polishing composition in a quantity in the range of 0.1 to 5000 ppm (0.00001 to 0.5% by mass), more preferably 1 to 1000 ppm (0.0001 to 0.1% by mass), and especially preferably 2 to 500 ppm (0.0002 to 0.05% by mass).

(Alkylene Polyalkylene Oxide Amine Polymer)

In order to further reduce substrate surface haze, the chemical-mechanical polishing composition of the present invention may further include, in addition to the polyoxyalkylene alkyl ether according to the present invention, an alkylene polyalkylene oxide amine polymer containing at least two repeating structural units containing a tertiary amine having an alkylene group and a polyalkyleneoxide group bound to an N atom. As described above, by using the alkylene polyalkylene oxide amine polymer along with the polyoxyalkylene alkyl ether according to the present application, a higher haze reduction effect as compared to the case in which either of them is used alone as an additive components can be achieved.

Though not particularly limited, the alkylene polyalkylene oxide amine polymer described above is represented by, for example, the following formula (vi):

where $R_3$ is a linear or branched $C_1$ to $C_{10}$ alkylene group, preferably a linear or branched $C_1$ to $C_4$ alkylene group, more preferably an ethylene group, $R_4$ is an alkylene group selected from the group consisting of an ethylene group, a propylene group, a butylene group, and combinations thereof, x is an integer from 2 to 1000, more preferably 2 to 20, and y is an integer from 2 to 10000, more preferably 2 to 500. $R_4$ is preferably selected from an ethylene group and/or a propylene group. When $R_4$ includes both an ethylene group and a propylene group, the ethylene group and the propylene group preferably have a molar ratio of 80:20 to 90:10.

The alkylene polyalkylene oxide amine polymer described above preferably has a solubility parameter (SP) of 9 to 10. In the present invention, the solubility parameter (SP) is calculated using Fedors' method, which is described in Ueda et al., Research on Paints, No. 152, October 2010, pp. 41-46.

The alkylene polyalkylene oxide amine polymer can have an average molecular weight of, for example, 5,000 to 100,000 or 10,000 to 80,000. When the average molecular weight thereof is less than 5,000, sufficient haze improvement cannot be achieved. Conversely, when the average molecular weight exceeds 100,000, the additive amount dependence on the effect brought about by the alkylene polyalkylene oxide amine polymer, for example, the effect of improving haze, becomes too large, which is not preferable.

The alkylene polyalkylene oxide amine polymer may be included in the chemical-mechanical polishing composition in a quantity of, for example, 1 ppm or more, 2 ppm or more, 5 ppm or more, or 10 ppm or more, and 5000 ppm or less, 3000 ppm or less, 1000 ppm or less, or 500 ppm or less, based on the mass of the aqueous carrier and all of the components which are dissolved or suspended therein. The alkylene polyalkylene oxide amine polymer may be preferably present in the chemical-mechanical polishing composition in a quantity in the range of 1 to 5000 ppm (0.0001 to 0.5% by mass), more preferably 2 to 1000 ppm (0.0002 to 0.1% by mass), and especially preferably 5 to 1000 ppm (0.0005 to 0.1% by mass).

The alkylene polyalkylene oxide amine polymer can be produced by any method which is known to a person skilled in the art. For example, the alkylene polyalkylene oxide amine polymer can be produced by the addition polymerization of alkylene oxide to the active hydrogen of a polyamine compound having two or more primary amino groups and/or secondary amino groups and containing 4 to 100 N atoms in the molecule. More specifically, the alkylene polyalkylene oxide amine polymer can be produced by the addition polymerization (graft polymerization) of alkylene oxide to the polyamine compound at 100 to 180° C. and 1 to 10 atm in the presence of an alkali catalyst. The aspect of the addition polymerization of alkylene oxide to polyamine compound is not particularly limited, and when two or more alkylene oxides are added, the form may be block-like or random.

Examples of the polyamine compound providing the main chain structure include polyethylene polyamines such as triethylenetetramine, tetraethylenepentamine, pentaethylenehexamine, and hexaethyleneheptamine, and polyalkyleneimines such as polyethyleneimine obtained by the polymerization of ethyleneimine. These compounds may be used alone or in a combination of two or more thereof to form a polyamine main chain structure. Examples of the alkylene oxide added to the main chain structure include ethylene oxide, propylene oxide, and butylene oxide. These alkylene oxides may be used alone or in a combination of two or more thereof.

[Other Additives]

The chemical-mechanical polishing composition of the present invention may optionally further include other water-soluble additives. Examples of such water-soluble additives include homopolymers and copolymers generated by polymerizing a vinyl monomer. Examples of such a vinyl monomer include styrene, chlorostyrene, α-methylstyrene, divinylbenzene, vinyl acetate, vinyl propionate, vinyl butyrate, vinyl octylate, vinyl caprate, vinyl laurate, vinyl myristate, vinyl stearate, vinyl adipate, vinyl (meth)acrylate, vinyl crotonate, vinyl sorbate, vinyl benzoate, vinyl cinnamate, acrylonitrile, limonene, cyclohexene, 2-vinylpyridine, 3-vinylpyridine, 4-vinylpyridine, N-vinylpyrrolidone, N-vinylacetamide, N-vinylmethylacetamide, vinylfuran, 2-vinyloxytetrapyran, methyl vinyl ether, ethyl vinyl ether, propyl vinyl ether, butyl vinyl ether, amyl vinyl ether, 2-ethylhexyl vinyl ether, octyl vinyl ether, nonyl vinyl ether, dodecyl vinyl ether, hexadecyl vinyl ether, octadecyl vinyl ether, butoxyethyl vinyl ether, cetyl vinyl ether, phenoxyethyl vinyl ether, allyl vinyl ether, methallyl vinyl ether, glycidyl vinyl ether, 2-chloroethyl vinyl ether, cyclohexyl vinyl ether, ethylene glycol monovinyl ether, polyethylene glycol monovinyl ether, propylene glycol monovinyl ether, polypropylene glycol monovinyl ether, 1,3-butylene glycol monovinyl ether, tetramethylene glycol monovinyl ether, hexamethylene glycol monovinyl ether, neopentyl glycol monovinyl ether, trimethylolpropane monovinyl ether, glycerin monovinyl ether, pentaerythritol monovinyl ether, and 1,4-cyclohexanedimethanol monovinyl ether.

Specific examples of the above other water-soluble additives include poly-N-vinyl pyrrolidone, poly-N-vinyl acetamide, polyglycerin, PEG/PEO or PEG-PPG block copolymers having a molecular weight of 1,000 to 1,000,000, alkylene oxide ethylenediamine adducts (EO mass ratio 35%, PPG molecular weight 4400, reverse-type), poly-2-ethyl oxazoline (average molecular weigh 500,000), polyacrylic acid (average molecular weight 25,000), and polyacrylate (average molecular weight 5,000).

[Rinse Composition]

The rinse composition of the present invention comprises:

a polyoxyalkylene alkyl ether represented by the formula (i) $RO\text{-}(AO)_n\text{--}H$, wherein R is a linear or branched $C_1$ to $C_{15}$ alkyl group, A is an alkylene group selected from the group consisting of an ethylene group, a propylene group, and a combination thereof, and n represents average addition mol numbers of AO and is 2 to 30, and an aqueous carrier.

By washing the substrate using the rinse composition of the present invention after chemical-mechanical polishing, the abrasive or the like remaining on the polishing pad can be removed, and also the same effects as the chemical-mechanical polishing composition of the present invention can be achieved. More specifically, substrate surface haze can be reduced and substrate surface wettability can be maintained. The details of the polyoxyalkylene alkyl ether and the aqueous carrier are as described above regarding the chemical-mechanical polishing composition of the present invention.

Furthermore, the rinse composition of the present invention may optionally further include a water-soluble polymer different from the above polyoxyalkylene alkyl ether. Though not particularly limited, such water-soluble polymer may be, for example, at least one selected from the group consisting of cellulose derivatives, polymers containing polyvinyl alcohol structural units, alkylene polyalkylene oxide amine polymers containing at least two repeating structural units containing a tertiary amine having an alkylene group and a poly alkyleneoxide group bound to an N atom, and any combinations thereof.

From the viewpoint of haze reduction, by using, for example, the above alkylene polyalkylene oxide amine polymer along with the polyoxyalkylene alkyl ether according to the present invention, a higher haze reduction effect as compared to the case in which either of them is used alone as an additive components can be achieved. Thus, from the viewpoint of haze reduction, the rinse composition of the present invention preferably includes, as the water-soluble polymer different from the polyoxyalkylene alkyl ether, an alkylene polyalkylene oxide amine polymer containing at least two repeating structural units containing a tertiary amine having an alkylene group and a polyalkyleneoxide group bound to an N atom. In a specific preferable aspect of the present invention, the water-soluble polymer may further include, in addition to the alkylene polyalkylene oxide amine polymer, a cellulose derivative and a polymer containing polyvinyl alcohol structural units. Further, for the same reasons as described above regarding the chemical-mechanical polishing composition of the present invention, the above water-soluble polymer used in the rinse composition of the present invention may be constituted by only a polymer containing polyvinyl alcohol structural units.

The details of the cellulose derivative, the polymer containing polyvinyl alcohol structural units, and the alkylene polyalkylene oxide amine polymer containing at least two repeating structural units containing a tertiary amine having an alkylene group and a polyalkyleneoxide group bound to an N atom used in the rinse composition of the present invention are as described above regarding the chemical-mechanical polishing composition of the present invention. Furthermore, the rinse composition may optionally further include other water-soluble additives. Likewise, the details of the other water-soluble additives are as described above regarding the chemical-mechanical polishing composition of the present invention.

[Substrate Chemical-Mechanical Polishing Method]

The method of chemically-mechanically polishing a substrate of the present invention comprises:

contacting a substrate with a polishing pad and the chemical-mechanical polishing composition described above, moving the polishing pad relative to the substrate with the chemical-mechanical polishing composition therebetween, and abrading at least a portion of the substrate to polish the substrate.

The method of chemically-mechanically polishing a substrate of the present invention is particularly suitable when used along with a chemical-mechanical polishing (CMP) device. Typically, such devices comprise a platen, during use, moving and having a velocity resulting from orbital, linear or circular motion, a polishing pad which contacts the platen and which moves with the platen when the platen moves, and a carrier that holds the substrate to be polished by contacting and moving relative to the surface of the polishing pad. Substrate polishing is carried out by contacting a polishing pad and the chemical-mechanical polishing composition of the present invention with a substrate, and thereafter, the polishing pad is moved relative to the substrate so that at least a portion of the substrate is abraded to polish the substrate.

A substrate can be levelled or polished with any suitable polishing pad and the chemical-mechanical polishing composition. The substrate may be not only a silicon substrate, but also a silicon substrate on which a polysilicon film, an $SiO_2$ film, or a metal wiring film is formed, a sapphire substrate, an SiC substrate, a GaAs substrate, a GaN substrate, or a substrate for forming TSV. Examples of suitable polishing pads include woven and nonwoven polishing pads. Further, a suitable polishing pad can include any suitable polymers having varying densities, hardnesses, thicknesses, compressibilities, repellent force to compression, and compressive moduli. Examples of suitable polymers include polyvinyl chloride, polyvinyl fluoride, nylon, fluorocarbon, polycarbonate, polyester, polyacrylate, polyether, polyethylene, polyamide, polyurethane, polystyrene, polypropylene, co-formed products thereof, and mixtures thereof.

In addition to a method in which a slurry of the chemical-mechanical polishing composition is prepared in advance and polishing is performed with a polishing pad while supplying the slurry to a substrate, the method of the present invention may be carried out by a method in which a diluent and a slurry stock solution are supplied to a polishing pad, and a slurry for polishing is prepared in the vicinity of the polishing pad.

[Substrate Rinsing Method]

The substrate rinsing method of the present invention comprises:

contacting a substrate after chemical-mechanical polishing with a polishing pad and the rinse composition described above, and moving the polishing pad relative to the substrate with the rinse composition therebetween.

By washing the substrate using the rinse composition of the present invention and the above method after chemical-mechanical polishing, abrasive or the like remaining on the polishing pad can be removed, and the same effects as the chemical-mechanical polishing composition of the present invention can be achieved. More specifically, substrate surface haze can be reduced, and substrate surface wettability can be maintained. The details of the CMP device, the substrate, and the polishing pad used in the method are as described above regarding the substrate chemical-mechanical polishing method.

The present invention will be described in more detail below by way of the Examples. However, the present invention is not limited by these Examples in any way.

EXAMPLES

In the Examples below, various chemical-mechanical polishing compositions according to the present invention were prepared, and when silicon substrates were polished using these compositions, haze characteristics and wettability of the substrate surfaces were examined.

Example A: Haze Characteristics Evaluation

[Preparation of Polishing Compositions 1 to 12 (Group I)]

Polishing compositions 1 to 12 were prepared by adding 5% by mass of colloidal silica (average primary particles size 25 nm), 0.2% by mass of ammonia, 0.28% by mass of hydroxyethyl cellulose, 0.01% by mass of the polyvinyl alcohol-polyethylene oxide graft copolymer represented by formula (iii) (polyvinyl alcohol:polyethylene oxide=80:20 mol %, molecular weight: 93,600, and degree of saponification: 98.5%), 0.05% by mass of the alkylene polyalkylene oxide amine polymer represented by formula (vi) (where $R_3$ is an ethylene group, EO:PO=8:2, average nitrogen number is 5, and molecular weight: 46,000), and the various polyoxyalkylene alkyl ethers of Table 1 below to water.

[Preparation of Polishing Compositions 13 to 15 (Group II)]

Polishing compositions 13 to 15 were prepared in the same manner as Group I except that the polyvinyl alcohol-polyethylene oxide graft copolymer and the alkylene polyalkylene oxide amine polymer were not added.

[Preparation of Polishing Compositions 16 and 17 (Group III)]

Polishing compositions 16 and 17 were prepared in the same manner as Group I except that the hydroxyethyl cellulose and the alkylene polyalkylene oxide amine polymer were not added. Note that polishing compositions 1 to 17 had pHs in the range of about 10 to about 10.4.

TABLE 1

| Polishing Composition | | | Polyoxyalkylene Alkyl Ether | | | | | | | |
|---|---|---|---|---|---|---|---|---|---|---|
| | | | | R Group of Formula (i) | | | | | | |
| No. | Grp | Name | Content (ppm) | Chain Structure | Carbon Number | EO No. | PO No. | HLB Value | Average Molecular Weight | Haze Improvement Rate (%) |
| 1 | I | Polyoxyethylene stearyl ether | 250 | Linear | 18 | 20 | 0 | 15.5 | 1134 | 85 |
| 2 | I | Polyoxyethylene stearyl ether | 100 | Linear | 18 | 100 | 0 | 18.9 | 4654 | 89 |
| 3 | I | Polyoxyethylene cetyl ether | 100 | Linear | 16 | 10 | 0 | 13.2 | 666 | 90 |
| 4 | I | Polyoxyethylene cetyl ether | 33 | Linear | 16 | 20 | 0 | 15.9 | 1106 | 91 |
| 5 | I | Polyoxyethylene isotridecyl ether | 50 | Branched | 13 | 8 | 0 | 13.2 | 536 | 91 |
| 6 | I | Polyoxyethylene tridecyl ether | 50 | Linear | 13 | 12 | 0 | 14.9 | 712 | 91 |
| 7 | I | Polyoxyethylene isotridecyl ether | 50 | Branched | 13 | 12 | 0 | 14.9 | 712 | 82 |
| 8 | I | Polyoxyethylene isotridecyl ether | 50 | Branched | 13 | 15 | 0 | 15.7 | 844 | 77 |
| 9 | I | Polyoxyethylene isotridecyl ether | 33 | Branched | 13 | 20 | 0 | 16.6 | 1064 | 93 |
| 10 | I | Polyoxyethylene lauryl ether | 10 | Linear | 12 | 23 | 0 | 17.1 | 1182 | 94 |
| 11 | I | Polyoxyethylene oxypropylene 2-propyl heptyl ether | 100 | Branched | 10 | 8 | 0.3 | 13.8 | 512 | 85 |
| 12 | I | Polyoxyethylene isodecyl ether | 100 | Branched | 10 | 11 | 0 | 15.5 | 626 | 90 |
| 13 | II | Polyoxyethylene stearyl ether | 250 | Linear | 18 | 20 | 0 | 15.5 | 1134 | 80 |
| 14 | II | Polyoxyethylene stearyl ether | 500 | Linear | 18 | 20 | 0 | 15.5 | 1134 | 70 |
| 15 | II | Polyoxyethylene isotridecyl ether | 50 | Branched | 13 | 8 | 0 | 13.2 | 536 | 83 |
| 16 | III | Polyoxyethylene stearyl ether | 100 | Linear | 18 | 20 | 0 | 15.5 | 1134 | 93 |
| 17 | III | Polyoxyethylene isotridecyl ether | 17.5 | Branched | 13 | 8 | 0 | 13.2 | 536 | 93 |

[Polishing Operation]

First, 12-inch p-type silicon wafers (silicon substrate) having a resistivity of 0.1 to 100 Ω·cm and <100> crystal orientation were washed with hydrofluoric acid (0.5%) at 23° C. for 2 minutes to remove the natural oxide films therefrom, and thereafter, the obtained silicon wafers were subjected to chemical-mechanical polishing treatment under the following conditions using slurries prepared by diluting the above-prepared polishing compositions by a factor of 20 (mass ratio) with pure water. The pHs of the diluted slurries were about 9.5 to about 9.9.

(1) CMP device: 12-inch single-sided polishing machine, Okamoto Machine Works SPP800S
(2) Wafer head: Template type
(3) Polishing pad: POLYPAS 27NX-PS manufactured by Fujibo Ehime, Co., Ltd.
(4) Platen rotation number: 31 rpm
(5) Polishing head rotation number: 33 rpm
(6) Polishing pressure: 2.2 psi=152 g/cm²=15 kPa
(7) Slurry supply amount: 500 mL/min (free-flowing)

After polishing, the silicon wafers were batch-washed for 20 minutes at 23° C. using SC-1 (a solution of ammonia (29% by mass aqueous solution):hydrogen peroxide (31% by mass aqueous solution):pure water=2:1:10 (volume ratio)). Next, the silicon wafers were scrub-washed using SC-1 (a solution of ammonia (29% by mass aqueous solution):hydrogen peroxide (31% by mass aqueous solution):

pure water=1:4:20 (volume ratio)) and a PVA brush at 23° C. using an SC-200S manufactured by Shibaura Mechatronics Corporation, and thereafter washed with pure water. The haze of the surfaces of the washed silicon wafers were evaluated as the value measured with a dark field wide grazing incidence channel (DWO) using a Surfscan SP2 manufactured by KLA Tencor Corporation. The results are shown in FIG. 1.

FIG. 1 shows the silicon wafer surface haze improvement rate (%) after polishing of the silicon wafers using polishing compositions 1 to 17. More specifically, FIG. 1 shows the relative proportions of the haze values for the polishing compositions as haze improvement rates, when the haze value for a polishing composition (control) which does not include polyoxyalkylene alkyl ether in each of Groups I to III is 100%. As is obvious from FIG. 1, in all of polishing compositions 1 to 17, which include polyoxyalkylene alkyl ether, the haze improvement rate was significantly below 100%, and thus, it can be understood that by adding polyoxyalkylene alkyl ether, the silicon wafer surface haze was reduced as compared with the case in which the polyoxyalkylene alkyl ether was not added.

Example B: Wettability Evaluation

Next, the reduction of substrate surface wettability as a result of the accumulation, on the polishing pad, of the additive components in the polishing composition was evaluated with respect to polishing compositions 1 to 17 described above. The wettability of the substrate surface was evaluated at each polishing time in the case in which chemical-mechanical polishing was performed continuously without performing pad conditioning between each polishing operation described in Example A, in order to simulate a long-duration substrate polishing operation. By continuing the polishing operation without performing pad conditioning using a brush or the like, the accumulation of additive components included in the polishing composition could be accelerated as compared to the case in which such pad conditioning is performed, and thus, it was possible to simulate a long-duration substrate polishing operation within a relatively short time. The results are shown in Table 2 below.

TABLE 2

| Polishing Composition No. | Grp | Polyoxyalkylene Alkyl Ether Name | Content (ppm) | R Group of Formula (i) Chain Structure | Carbon Number | EO No. | PO No. | HLB Value | Average Molecular Weight |
|---|---|---|---|---|---|---|---|---|---|
| 1 | I | Polyoxyethylene stearyl ether | 250 | Linear | 18 | 20 | 0 | 15.5 | 1134 |
| 2 | I | Polyoxyethylene stearyl ether | 100 | Linear | 18 | 100 | 0 | 18.9 | 4654 |
| 3 | I | Polyoxyethylene cetyl ether | 100 | Linear | 16 | 10 | 0 | 13.2 | 666 |
| 4 | I | Polyoxyethylene cetyl ether | 33 | Linear | 16 | 20 | 0 | 15.9 | 1106 |
| 5 | I | Polyoxyethylene isotridecyl ether | 50 | Branched | 13 | 8 | 0 | 13.2 | 536 |
| 6 | I | Polyoxyethylene tridecyl ether | 50 | Linear | 13 | 12 | 0 | 14.9 | 712 |
| 7 | I | Polyoxyethylene isotridecyl ether | 50 | Branched | 13 | 12 | 0 | 14.9 | 712 |
| 8 | I | Polyoxyethylene isotridecyl ether | 50 | Branched | 13 | 15 | 0 | 15.7 | 844 |
| 9 | I | Polyoxyethylene isotridecyl ether | 33 | Branched | 13 | 20 | 0 | 16.6 | 1064 |
| 10 | I | Polyoxyethylene lauryl ether | 10 | Linear | 12 | 23 | 0 | 17.1 | 1182 |
| 11 | I | Polyoxyethylene oxypropylene 2-propyl heptyl ether | 100 | Branched | 10 | 8 | 0.3 | 13.8 | 512 |
| 12 | I | Polyoxyethylene isodecyl ether | 100 | Branched | 10 | 11 | 0 | 15.5 | 626 |
| 13 | II | Polyoxyethylene stearyl ether | 250 | Linear | 18 | 20 | 0 | 15.5 | 1134 |
| 14 | II | Polyoxyethylene stearyl ether | 500 | Linear | 18 | 20 | 0 | 15.5 | 1134 |
| 15 | II | Polyoxyethylene isotridecyl ether | 50 | Branched | 13 | 8 | 0 | 13.2 | 536 |
| 16 | III | Polyoxyethylene stearyl ether | 100 | Linear | 18 | 20 | 0 | 15.5 | 1134 |
| 17 | III | Polyoxyethylene isotridecyl ether | 17.5 | Branched | 13 | 8 | 0 | 13.2 | 536 |

| Polishing Composition No. | Grp | Substrate Surface Wettability After Polishing (%) | | | | Haze Value Evaluation | | | Remarks |
|---|---|---|---|---|---|---|---|---|---|
| | | 0 min | 30 min | 55 min | Result | 0 min | 30 min | 55 min | |
| 1 | I | 100 | 0 | 0 | Fail | Pass | Fail | Fail | Comp. Ex. |
| 2 | I | 100 | 95 | 80 | Fail | Pass | Fail | Fail | Comp. Ex. |
| 3 | I | 85 | 20 | 10 | Fail | Pass | Pass | Pass | Comp. Ex. |
| 4 | I | 100 | 100 | 90 | Fail | Pass | Pass | Pass | Comp. Ex. |
| 5 | I | 100 | 100 | 100 | Pass | Pass | Pass | Pass | Example |
| 6 | I | 100 | 100 | 100 | Pass | Pass | Pass | Pass | Example |
| 7 | I | 100 | 100 | 100 | Pass | Pass | Pass | Pass | Example |
| 8 | I | 100 | 100 | 100 | Pass | Pass | Pass | Pass | Example |
| 9 | I | 100 | 100 | 100 | Pass | Pass | Pass | Pass | Example |
| 10 | I | 100 | 100 | 100 | Pass | Pass | Pass | Pass | Example |
| 11 | I | 100 | 100 | 100 | Pass | Pass | Pass | Pass | Example |
| 12 | I | 100 | 100 | 100 | Pass | Pass | Pass | Pass | Example |
| 13 | II | 100 | 80 | 30 | Fail | Pass | Pass | Pass | Comp. Ex. |
| 14 | II | 30 | 0 | 0 | Fail | Pass | Fail | Fail | Comp. Ex. |
| 15 | II | 100 | 100 | 100 | Pass | Pass | Pass | Pass | Example |

TABLE 2-continued

| | | | | | | | | | |
|---|---|---|---|---|---|---|---|---|---|
| 16 | III | 80 | 0 | 0 | Fail | Pass | Fail | Pass | Comp. Ex. |
| 17 | III | 100 | 100 | 100 | Pass | Pass | Pass | Pass | Example |

The "0 min", "30 min", and "55 min" of the column "Substrate Surface Wettability After Polishing (%)" of Table 2 respectively represents the start time of polishing. For example, "0 min" data represents substrate surface wettability after polishing by the polishing operation described in Example A has started at 0 minute, and polishing has completed (i.e., after the polishing shown in Table 1). Furthermore, "30 min" data represents wettability of the surface of the substrate after polishing for 30 minutes and subsequently polishing. The same is true for "55 min" data. Substrate wettability was evaluated by determining by visual observation of the percentage of the substrate surface which was wetted after completion of the polishing initiated at each time. When the entire surface of the substrate surface was wet (100%), it was considered a pass, and when even a portion of the substrate surface was not wet (less than 100%), it was considered a fail. Further, in Table 2, the haze values were similarly evaluated after polishing started at "0 mins", "30 mins", and "55 mins" had completed. Specifically, like in the case of FIG. 1, the relative percentage of the haze value for each polishing composition, when the haze value for a polishing composition (control) which does not include polyoxyalkylene alkyl ether in each of Groups I to III was set as 100%, was calculated. A haze value of less than 125% was considered a pass, and a haze value which is equal to or greater than 125% was considered a fail.

Figure 2:
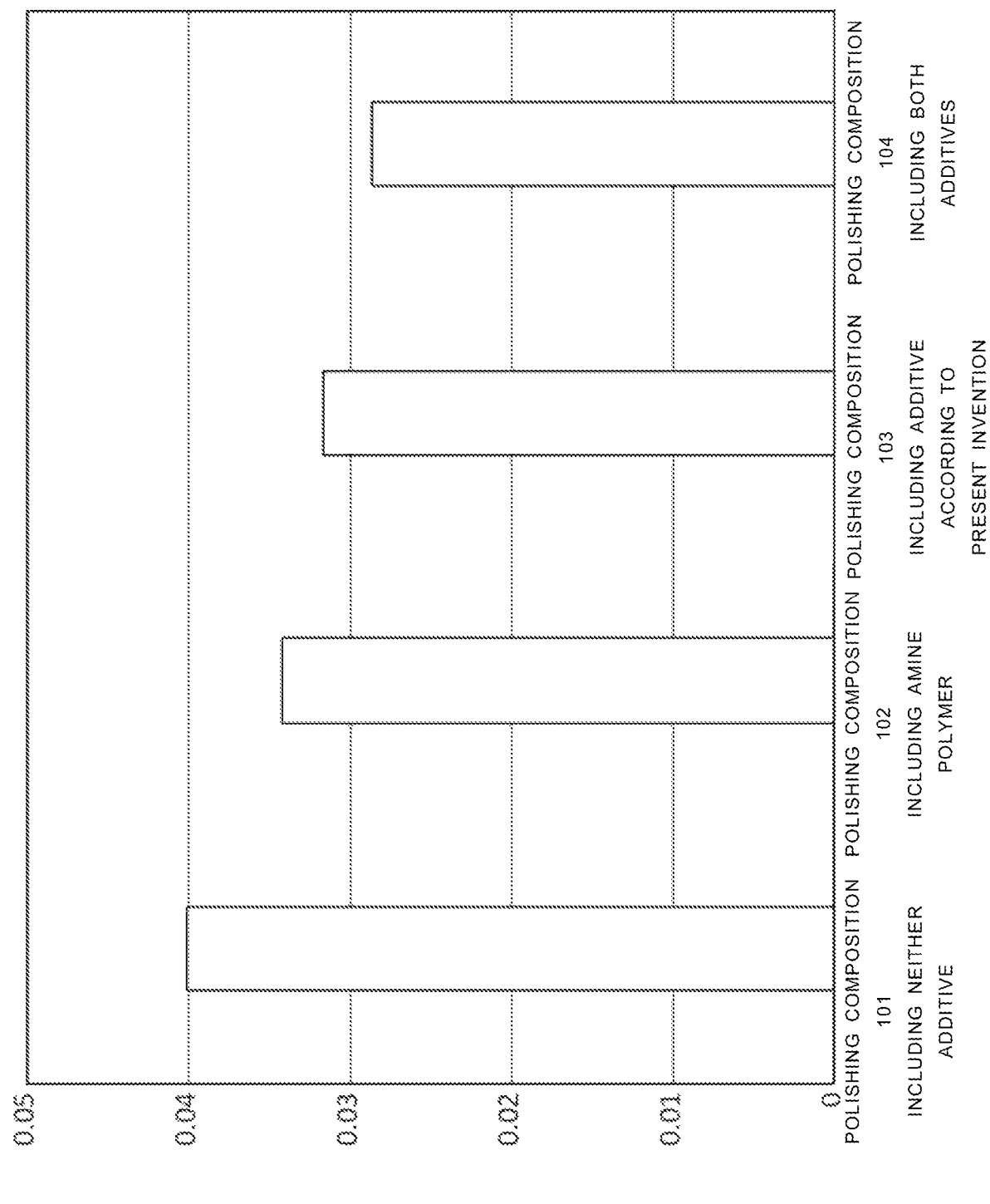
FIG. 2 is a graph showing the effects of the combination of the polyoxyalkylene alkyl ether according to the present invention with an alkylene polyalkylene oxide amine polymer, which is a water-soluble polymer different from the polyoxyalkylene alkyl ether according to the present invention.

Referring to FIG. 2, the substrate surface wettabilities of polishing compositions 5 to 12, 15, and 17, which correspond to the case in which the carbon number of the R group of the polyoxyalkylene alkyl ether represented by formula (i) was 15 or less, were 100% at all times of the 0 min, 30 min, and 55 min. Conversely, the substrate surface wettabilities of polishing composition 1 to 4, 13, 14 and 16 in which a polyoxyalkylene alkyl ether in which the carbon number of the R group was 16 or more, specifically, polyoxyethylene cetyl ether and polyoxyethylene stearyl ether, was used, decreased over time. Note that the parameters other than carbon number, such as the EO number and PO number, which relate to the average addition mol numbers of AO in the polyoxyalkylene alkyl ether represented by formula (i), as well as the HLB value and average molecular weight did not have a clear correlation with substrate surface wettability.

Regarding haze value evaluation, for polishing compositions 5 to 12 and 17 for which the wettability evaluation was good, the haze value evaluations were good at all times of 0 minutes, 30 minutes, and 55 minutes. However, regarding the polishing compositions which failed the wettability evaluation, though the haze value evaluations of polishing compositions 3, 4, and 13 were good, for polishing compositions 1, 2, 14, and 16, in which polyoxyethylene stearyl ether was used as the polyoxyalkylene alkyl ether, the haze values were poor as compared to a polishing composition (control) which did not include the polyoxyethylene stearyl ether was observed.

[Defect Evaluation]

Regarding the polishing compositions of Groups I and II of Tables 1 and 2, the formation of light-point defects (LPD) when silicon wafers were polished using these polishing compositions was examined.

More specifically, like the case of haze measurement, the LPDs of the cleaned silicon wafers were evaluated by the value of LPD measured in a dark-field composite grazing incidence channel (DCO) using a Surfscan SP2 manufactured by KLA Tencor Corporation. The cases of 500 or fewer LPDs of 37 nm or more/silicon wafer regarding substrate surface at 55 minutes in the test of Table 2 were considered a pass. The results are shown in Table 3.

TABLE 3

| Polishing Composition | | | LPD #/ | | |
|---|---|---|---|---|---|
| No. | Group | Polyoxyalkylene Alkyl Ether | Substrate | Result | Remarks |
| 1 | I | Polyoxyethylene stearyl ether | 3456 | Fail | Comp. Ex. |
| 2 | I | Polyoxyethylene stearyl ether | 7059 | Fail | Comp. Ex. |
| 3 | I | Polyoxyethylene cetyl ether | 300 | Pass | Comp. Ex. |
| 4 | I | Polyoxyethylene cetyl ether | 69 | Pass | Comp. Ex. |
| 5 | I | Polyoxyethylene isotridecyl ether | 136 | Pass | Example |
| 6 | I | Polyoxyethylene tridecyl ether | 264 | Pass | Example |
| 7 | I | Polyoxyethylene isotridecyl ether | 89 | Pass | Example |
| 8 | I | Polyoxyethylene isotridecyl ether | 81 | Pass | Example |
| 9 | I | Polyoxyethylene isotridecyl ether | 134 | Pass | Example |
| 10 | I | Polyoxyethylene lauryl ether | 88 | Pass | Example |
| 11 | I | Polyoxyethylene oxypropylene 2-propyl heptyl ether | 42 | Pass | Example |
| 12 | I | Polyoxyethylene isodecyl ether | 23 | Pass | Example |
| 13 | II | Polyoxyethylene stearyl ether | 3080 | Fail | Comp. Ex. |
| 14 | II | Polyoxyethylene stearyl ether | 146 | Pass | Comp. Ex. |
| 15 | II | Polyoxyethylene isotridecyl ether | 36 | Pass | Example |

Referring to Table 3, regarding polishing compositions 5 to 12 and 15, for which the wettability evaluation was good, the value of LPD was relatively small. By improving substrate surface wettability, the occurrence of substrate surface defects could be suppressed. Conversely, regarding polishing compositions which failed the wettability evaluation, though the LPD numbers of polishing compositions 3, 4, and 14 were relatively small, a large number of defects were detected in polishing compositions 1, 2 and 13, and a degree of correlation with the wettability evaluation was identified.

Example C: Influence of Other Water-Soluble Polymer

The effect of combining the polyoxyalkylene alkyl ether according to the present invention with a water-soluble polymer which is different therefrom, more specifically, an alkylene polyalkylene oxide amine polymer, on substrate surface haze reduction was examined.

[Preparation of Polishing Composition 101 (Including Neither Additive)]

Polishing composition 101, which includes neither the polyoxyalkylene alkyl ether according to the present invention nor the alkylene polyalkylene oxide amine polymer, was prepared in the same manner as Group I of Example A except that the polyoxyalkylene alkyl ether and the alkylene polyalkylene oxide amine polymer were not added.

[Preparation of Polishing Composition 102 (Including Amine Polymer)]

Polishing Composition 102, which does not include the polyoxyalkylene alkyl ether according to the present invention but which includes the alkylene polyalkylene oxide amine polymer ($R_3$:ethylene group, EO:PO=8:2, average nitrogen number: 5, molecular weight: 46,000), was prepared in the same manner as Group I of Example A except that the polyoxyalkylene alkyl ether was not added.

[Preparation of Polishing Composition 103 (Including Polyoxyalkylene Alkyl Ether)]

Polishing composition 103, which does not include the alkylene polyalkylene oxide amine polymer but which includes the polyoxyalkylene alkyl ether according to the present invention, was prepared in the same manner as Group I of Example A except that the alkylene polyalkylene oxide amine polymer was not added and 50 ppm of polyoxyethylene isotridecyl ether (R group carbon number: 13, average addition mol numbers of EO: 8) was added.

[Preparation of Polishing Composition 104 (Including Both Additives)]

Polishing composition 104, which includes both the polyoxyalkylene alkyl ether according to the present invention and the alkylene polyalkylene oxide amine polymer ($R_3$: ethylene group, EO:PO=8:2, average nitrogen number: 5, molecular weight: 46,000), was prepared in the same manner as Group I of Example A except that 50 ppm of polyoxyethylene isotridecyl ether (R group carbon number: 13, average addition mol numbers of EO: 8) was added.

As in the case of Example A, silicon wafers were subjected to chemical-mechanical polishing treatment using polishing compositions 101 to 104, and the hazes of the silicon wafer surfaces were evaluated. The results are shown in FIG. 2. FIG. 2 is a graph showing the effects of the combination of the polyoxyalkylene alkyl ether according to the present invention with the alkylene polyalkylene oxide amine polymer, which is a water-soluble polymer different therefrom.

Referring to FIG. 2, it could be understood that when both the polyoxyalkylene alkyl ether and the alkylene polyalkylene oxide amine polymer are included, as in polishing composition 104, a higher haze reduction effect, as compared to polishing composition 101, which includes neither of them as additive components, and polishing compositions 102 and 103, which each includes either of them alone as an additive component, could be achieved. Since the effects of additive components generally have a saturation region, even if the contents thereof are increased, the corresponding effects cannot be sufficiently obtained in the region above a certain content. Thus, it is difficult to greatly improve haze value by simply increasing the content of the polyoxyalkylene alkyl ether according to the present invention. Furthermore, when the content of the polyoxyalkylene alkyl ether is excessively high, the amount of polyoxyalkylene alkyl ether which accumulates on the polishing pad also increased, which is not preferable from the viewpoint of improving wettability.

Thus, by adding the alkylene polyalkylene oxide amine polymer along with the polyoxyalkylene alkyl ether, a haze reduction effect that cannot be achieved with polyoxyalkylene alkyl ether alone could be obtained, as indicated by polishing composition 104 of FIG. 2. Thus, according to the chemical-mechanical polishing composition of the present invention, which includes a combination of the polyoxyalkylene alkyl ether and the alkylene polyalkylene oxide amine polymer, in addition of the substrate wettability effect demonstrated in Example B, an extremely high haze reduction effect could be achieved.

The invention claimed is:

1. A chemical mechanical polishing composition comprising:
   a polishing agent;
   a basic component;
   a polyoxyalkylene alkyl ether represented by Formula (i) RO-$(AO)_n$—H, where R represents a linear or branched $C_{11}$-$C_{15}$ alkyl group, A represents an alkylene group selected from a group consisting of an ethylene group, a propylene group, and a combination thereof, and n represents the average number of moles of added AO groups, the number being from 6 to 30; and
   an aqueous carrier.

2. A chemical-mechanical polishing composition according to claim 1, further comprising a water-soluble polymer other than the polyoxyalkylene alkyl ether.

3. A chemical mechanical polishing composition according to claim 2, wherein the water-soluble polymer includes at least one type selected from a group consisting of a cellulose derivative, a polymer containing a polyvinyl alcohol structural unit, an alkylene polyalkylene oxide amine polymer including at least two repeating structural units having a tertiary amine with an alkylene group and a polyalkylene oxide group bonded to an N atom, and any combination thereof.

4. A chemical mechanical polishing composition according to claim 3, wherein the water-soluble polymer includes a cellulose derivative, a polymer containing a polyvinyl alcohol structural unit, and an alkylene polyalkylene oxide amine polymer including at least two repeating structural units having a tertiary amine with an alkylene group and a polyalkylene oxide group bonded to an N atom.

5. A chemical mechanical polishing composition according to claim 3, wherein the water-soluble polymer is a polymer containing a polyvinyl alcohol structural unit.

6. A chemical mechanical polishing composition comprising:
   a polishing agent;
   a basic component;
   a polyoxyalkylene alkyl ether including at least one of polyoxyethylene oxypropylene 2-propyl heptyl ether and polyoxyethylene isotridecyl ether;
   further comprising a water-soluble polymer other than the polyoxyalkylene alkyl ether; and
   an aqueous carrier.

7. A chemical mechanical polishing composition comprising:
   a polishing agent;
   a basic component;

a polyoxyalkylene alkyl ether represented by Formula (i) RO-(AO)$_n$—H, where R represents a linear or branched C$_1$-C$_{15}$ alkyl group, A represents an alkylene group selected from a group consisting of an ethylene group, a propylene group, and a combination thereof, and n represents the average number of moles of added AO groups, the number being from 2 to 30;

an aqueous carrier; and a water-soluble polymer containing an alkylene polyalkylene oxide amine polymer including at least two repeating structural units having a tertiary amine with an alkylene group and a polyalkylene oxide group bonded to an N atom.

8. A chemical mechanical polishing method for a base material comprising the steps of:

bringing a base material into contact with a polishing pad and a chemical mechanical polishing composition of claim 1;

moving the polishing pad against the base material with the chemical mechanical polishing composition interposed therebetween; and removing at least some of the base material to polish the base material.

9. A rinsing composition comprising:

a polyoxyalkylene alkyl ether represented by Formula (i) RO-(AO)$_n$—H, where R represents a linear or branched C$_{11}$-C$_{15}$ alkyl group, A represents an alkylene group selected from a group consisting of an ethylene group, a propylene group, and a combination thereof, and n represents the average number of moles of added AO groups, the number being from 6 to 30 and an aqueous carrier.

10. A rinsing composition according to claim 9, further comprising a water-soluble polymer other than the polyoxyalkylene alkyl ether.

11. A rinsing composition according to claim 10, wherein the water-soluble polymer includes at least one type selected from a group consisting of a cellulose derivative, a polymer containing a polyvinyl alcohol structural unit, an alkylene polyalkylene oxide amine polymer including at least two repeating structural units having a tertiary amine with an alkylene group and a polyalkylene oxide group bonded to an N atom, and any combination thereof.

12. A rinsing composition according to claim 11, wherein the water-soluble polymer includes a cellulose derivative, a polymer containing a polyvinyl alcohol structural unit, and an alkylene polyalkylene oxide amine polymer including at least two repeating structural units having a tertiary amine with an alkylene group and a polyalkylene oxide group bonded to an N atom.

13. A rinsing composition according to claim 11, wherein the water-soluble polymer is a polymer containing a polyvinyl alcohol structural unit.

14. A rinsing method for a base material comprising the steps of:

bringing a base material after chemical mechanical polishing into contact with a polishing pad and a rinsing composition of claim 9; and moving the polishing pad against the base material with the rinsing composition interposed therebetween.

15. A rinsing composition comprising: a polyoxyalkylene alkyl ether represented by Formula (i) RO-(AO)$_n$—H, where R represents a linear or branched C$_1$-C$_{15}$ alkyl group, A represents an alkylene group selected from a group consisting of an ethylene group, a propylene group, and a combination thereof, and n represents the average number of moles of added AO groups, the number being from 2 to 30;

an aqueous carrier; and a water-soluble polymer containing an alkylene polyalkylene oxide amine polymer including at least two repeating structural units having a tertiary amine with an alkylene group and a polyalkylene oxide group bonded to an N atom.

* * * * *